United States Patent [19]

Magdo et al.

[11] 4,016,596
[45] Apr. 5, 1977

[54] HIGH PERFORMANCE INTEGRATED BIPOLAR AND COMPLEMENTARY FIELD EFFECT TRANSISTORS

[75] Inventors: Ingrid Emese Magdo; Steven Magdo, both of Hopewell Junction, N.Y.

[73] Assignee: International Business Machines Corporation, Armonk, N.Y.

[22] Filed: Jan. 26, 1976

[21] Appl. No.: 652,268

Related U.S. Application Data

[62] Division of Ser. No. 588,524, June 19, 1975, Pat. No. 3,955,269.

[52] U.S. Cl. .................................. 357/43; 357/34; 357/48; 357/49; 357/50
[51] Int. Cl.² .................. H01L 27/02; H01L 29/72; H01L 27/04; H01L 27/12
[58] Field of Search .................. 357/34, 35, 43, 48, 357/49, 50

[56] References Cited

UNITED STATES PATENTS

| | | | |
|---|---|---|---|
| 3,858,231 | 12/1974 | Magdo et al. | 357/49 |
| 3,886,000 | 5/1975 | Bratter et al. | 357/49 |
| 3,954,523 | 5/1976 | Magdo | 357/49 |

OTHER PUBLICATIONS

Hybrid IGFET-Bipolar Transistor; by Malin et al. IBM Technical Disclosure Bulletin; vol. 12 No. 12 May 1970 pp. 2327–2328.
Electronics International, pp. 136 and 137, Aug. 31, 1970.
IBM Technical Disclosure Bulletin by Antipov, vol. 17, No. 1, June 1974, pp. 102 and 103.

*Primary Examiner*—Andrew J. James
*Attorney, Agent, or Firm*—Thomas F. Galvin

[57] ABSTRACT

A method for fabricating both bipolar as well as complementary MOS field effect transistors, i.e., BI-CMOS transistors in the same semiconductor substrate. The preferred embodiment of the method provides bipolar and CMOS transistors having breakdown voltages ($BV_{ceo}$) in excess of 10 volts and CMOS devices having no latchup problems, with a minimum number of processing steps. The method also contemplates the formation of auxiliary devices such as resistors and Schottky Barrier diodes.

7 Claims, 9 Drawing Figures

4,016,596

HIGH PERFORMANCE INTEGRATED BIPOLAR AND COMPLEMENTARY FIELD EFFECT TRANSISTORS

This is a division of application Ser. No. 588,524 filed June 19, 1975, now U.S. Pat. No. 3,955,269.

BACKGROUND OF THE INVENTION

This invention relates to methods for manufacturing semiconductor devices. In particular, it relates to a process for fabricating bipolar and complementary field effect transistors in the same semiconductor substrate.

DESCRIPTION OF THE PRIOR ART

Integrated circuits including both bipolar and field effect transistors are desirable for many applications. Both types of devices have advantages and disadvantages with respect to the other such that the use of both is required in some systems. For example, in a memory system, the CMOS device has the advantages of low power, high density and medium speed as compared to the bipolar transistor. However, the logic circuitry associated with the memory should be faster than the memory itself because of the greater data processing delays. Thus, a CMOS FET memory associated with bipolar logic is a very desirable combination. In these type systems, the MOS devices are most often fabricated on separate chips from the bipolar devices. Alternatively, the devices are fabricated in segregated areas on the same chip. The present processes for fabricating both types of devices are relatively incompatible in that far fewer processing steps are required to form CMOS devices and bipolar devices. In addition, various types of parasitic currents and other interactions between the various regions and the semiconductor have made integrated BI-CMOS devices impractical for commercial production.

The CMOS devices are prone to parasitic latchup due to silicon controlled rectifier (SCR) action among the P and N regions. In certain instances, a PNPN device is activated in the CMOS active regions and, with the application of a transient potential, the device acts as a SCR, i.e., when the device turns on, it cannot be turned off merely by removing the turn on potential. It is rather common knowledge in the semiconductor circuit industry that CMOS products commercially available suffer from the SCR problem so that variations in the power supply must be greatly restricted. A more detailed discussion of this phenomenon is given in the application of Bhatia et al., Ser. No. 537,511, filed on Dec. 30, 1974 and assigned to the same assignee as the present invention.

Recently, a CMOS transistor has been designed by the present inventors which overcomes the SCR problem by significantly reducing leakage current between the active regions of the transistors. The method and structure has been published in the IBM Technical Disclosure Bulletin in the article entitled, "Fabricating Complementary MOS Transistors", Vol. 16, No. 6, November 1972, pages 1767 and 1768. In the method, the FET's are formed in an epitaxial layer, with the active regions of one device substantially completely isolated from the regions of other devices by a technique of dielectric isolation termed recessed oxidation isolation (ROI).

Depending on the initial conductivity type of the epitaxial layer, the channel regions of either the N or the P channel FET's are formed by outdiffusion from a buried layer into an epitaxial layer.

Integrated circuits fabricated from bipolar transistors are much less susceptible to interactions among devices than are CMOS integrated circuits. There are numerous techniques for insuring isolation among bipolar transistors which have made it possible to fabricate integrated circuits having densities which were merely speculative a few years ago. To our knowledge, the best type of isolation for bipolar transistors is also ROI. In particular, a bipolar transistor having a semiconductor pedestal extending from a buried subcollector to the base region, with the base and emitter regions disposed wholly within a ROI layer, allows the highest density of transistors achievable today. Such a technique is described in U.S. Pat. No. 3,796,613, in the names of the present inventors entitled "Method for Forming Dielectric Isolation for High Density Pedestal Semiconductor Devices".

In attempting to fabricate integrated circuits comprising BI-CMOS transistors, it is quite natural to utilize the combined teachings in the above-referenced IBM Technical Disclosure Bulletin entitled "Fabricating Complementary MOS Transistors" and U.S. Pat. No. 3,796,613 entitled "Method of Forming Dielectric Isolation for High Density Pedestal Semiconductor Devices". However, the devices so fabricated are not effective when integrated as BI-CMOS transistors requiring high breakdown voltages. In particular, the breakdown voltage, $BV_{ceo}$, of the bipolar transistor is too low to be useful. The basic problem is that the power supply to the CMOS devices is too high for the bipolar device to withstand. The design rules of a typical CMOS circuit calls for a supply voltage of around 8.5 volts. Bipolar transistors formed on the same chip cannot withstand this large a potential.

More suprisingly, the FET having its channel region formed from the outdiffused buried layer also exhibits too low a breakdown voltage.

SUMMARY OF THE INVENTION

It is, therefore, the primary object of this invention to fabricate a BI-CMOS device in which both the CMOS devices as well as the bipolar transistors have high breakdown voltage.

It is a further object of this invention to fabricate these devices economically with a minimum number of processing steps.

Yet another object of our invention is to fabricate auxiliary devices such as resistors and Schottky Barrier diodes using the same basic processing steps.

These and other objects of the invention are achieved by improving the method of forming dielectrically isolated bipolar and field effect transistors. The semiconductor substrate is initially processed to contain both a buried region to serve as the subcollector region of the bipolar transistor as well as another buried region to form a channel region for one of the FET's. A first epitaxial layer is deposited on the substrate, with the buried regions outdiffusing therein. A dielectric layer is deposited onto the first epitaxial layer. Selected portions of the dielectric layer are then etched to expose the surface of the first epitaxial layer at areas where the active devices will be formed. An epitaxial layer is grown in the surface. Monocrystalline silicon grows over the exposed silicon areas and polycrystalline silicone grows over the dielectric layer. A pedestal base region for the bipolar transistor is formed in the single crystal region above the buried subcollector. CMOS FET devices are formed in the single crystal region over the first epitaxial layer and over the other buried region which has outdiffused to the surface of the second epitaxial layer during the deposition of the epitaxial layer.

The outdiffusion of the FET buried region from the semiconductor substrate ensures that the doping level of the region at the surface of the first epitaxial layer is sufficiently low to ensure a high breakdown voltage between the heavily doped source and drain regions of the FET and said other buried region, which is of opposite conductivity type to the source and drain regions.

The pedestal base region of the bipolar transistor is not directly contacted by the buried subcollector region. A lightly doped region of the same conductivity type as the buried region separates the base and subcollector, thereby ensuring a high breakdown voltage for the bipolar transistor.

The foregoing and other objects, features and advantages of the invention will be apparent from the following more particular description of the preferred embodiments of the invention, as illustrated in the accompanying drawing.

DESCRIPTION OF THE PREFERRED EMBODIMENT

For the preferred embodiment, a P—type silicon substrate is utilized to form an NPN type pedestal semiconductor device, a pair of CMOS devices and N type resistors and Schottky Barrier Diodes. It will be understood, of course, that the invention will also be applicable to opposite conductivity type bipolar transistors and resistors as well as to other types of devices. In addition, the description of the preferred method contemplates forming a P+ region outdiffused from the initial substrate for the N channel FET. With opposite conductivity type regions used throughout, however, the device could also comprise a P channel device having an N+ region formed under its channel.

A suitable wafer 4 of P— material having a high quality polished surface is thermally oxidized in the usual manner. For example, the silicon body may be placed in an oxidizing atmosphere in an elevated temperature in steam or dry oxygen. This is by far the most common method of oxidizing bare silicon, although pyrolytic deposition of silicon dioxide or other insulating material may also be used. An opening is made in oxide layer 8 using conventional photoresist and etching techniques. N+ region 6 is formed by thermally diffusing an N+ impurity such as phosphorous, arsenic, antimony or the like through the window in oxide layer 8. For reasons well known to those with skill in the art, arsenic is preferable for forming region 6 which will subsequently serve as the buried subcollector of the NPN transistor. To ensure that the collector series resistance for the NPN transistor is sufficiently low, the initial concentration, Co, of arsenic or antimony should be between $6 \times 10^{19}$ to $2 \times 10^{20}$ atoms/cm$^3$.

Figure 1:
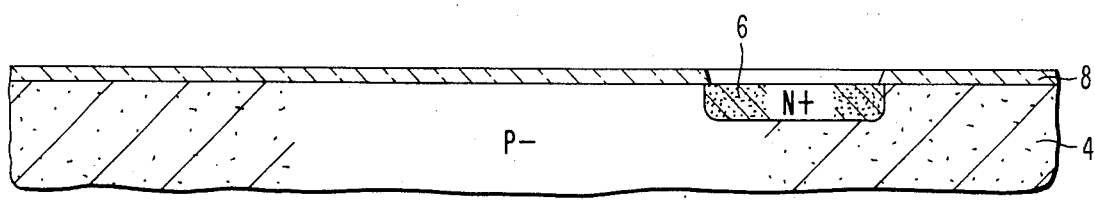
FIGS. 1 through 8 show sectional views of the novel method used to produce the BI-CMOS transistors.
Figure 2:
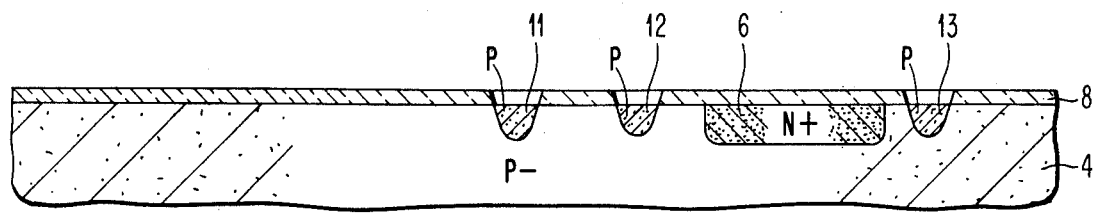

The wafer is then reoxidized and openings are made in oxide layer 8, as shown in FIG. 2, for P type regions 11, 12 and 13. Regions 12 and 13 comprise a single isolation diffusion which will surround the N+ region 6 at the completion of the process. P region 11 will serve to form the channel region of the N-channel field effect transistor to be fabricated; it is necessary to avoid SCR action between adjacent field effect transistors.

The P regions are formed by conventional diffusion techniques with the impurity preferably being boron, although other P type impurities could be used. The initial concentration, Co, of boron is preferably $\geq 10^{20}$ atoms/cm$^3$.

Silicon dioxide layer 8 is then stripped from the surface of wafer 4 by use of a buffered ammonium fluoride solution of hydroflouric acid. A first epitaxial layer 5 of N-type conductivity is then grown over the bare surface of wafer 4. The thickness of layer 5 is preferably between around 1.5 to 3 microns at a doping level of $\leq 10^{16}$ atoms/cm$^3$.

During the deposition process, regions 11, 12, 13 and 6 outdiffuse into epitaxial layer 5. With the P doped regions being boron and the N doped regions 6 being arsenic, the P+ regions diffuse to the surface of layer 5, while the N+ region 6 diffuses only partially into region 5 because boron has a faster outdiffusion rate than arsenic. This property of these materials, as well as the techniques for forming an epitaxial layer, are well known in the art and are not claimed to be inventive in themselves.

Figure 3:
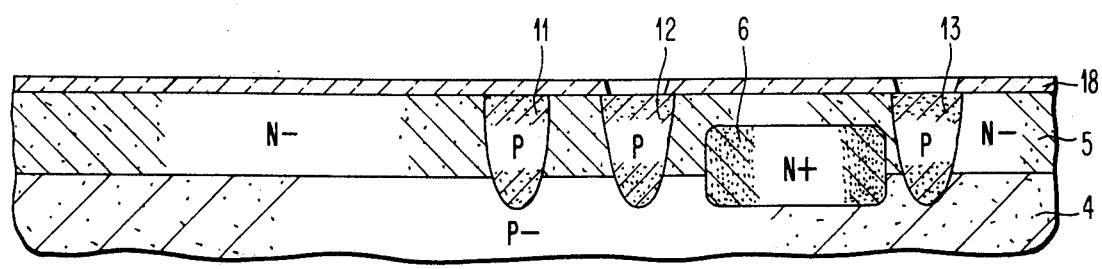

After the epitaxial deposition process is completed, oxide layer 18 is thermally grown over the surface of layer 5; and openings are subsequently made by standard techniques in the oxide layer 8 to expose regions 12 and 13, as shown in FIG. 3. Boron is again thermally diffused into regions 12 and 13 to increase the conductivity level of regions 12 and 13 as compared to region 11.

This step ensures that the impurity level of the isolation ring 12/13 surrounding the subcollector region of the bipolar transistor is sufficiently high to avoid inversion at the surface of epitaxial layer 5. The concentration level of regions 12 and 13 contiguous to oxide layer 18 should be greater than or equal to $5 \times 10^{17}$ atoms per cm$^3$.

As distinguished from the high surface concentration of the isolation regions, it is important the P region 11 have a relatively low doping level of around $4 \times 10^{16}$ to $10^{17}$ atoms per cm$^3$ at the surface of epi layer 5. As will be explained in greater detail in a later section of this specification, this ensures a high breakdown voltage of the field effect transistor formed over P region 11. Since this doping level is not enough for isolation, the impurity levels of regions 12 and 13 contiguous to oxide layer 18 must be fortified by some means. The most practical technique is the added step, as described, of diffusing added impurities into the windows opened in oxide layer 18.

Figure 4:
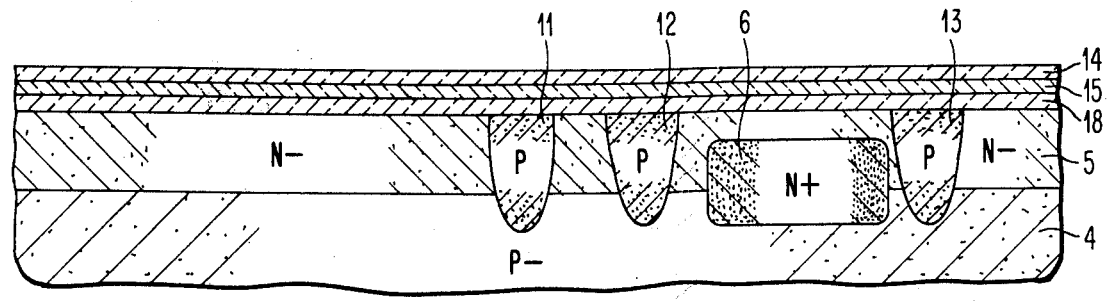

The surface of the wafer is then reoxidized to achieve a layer of around 1,000A of silicon dioxide. A composite layer of silicon nitride 15 and pyrolytically deposited silicon dioxide 14 is then deposited atop thermally grown SiO$_2$, as is illustrated in FIG. 4. Sputtered SiO$_2$ might be used instead of pyrolytically deposited SiO$_2$. The purpose of oxide layer 14 is to mask nitride layer 15, because etchants which etch silicon nitride also etch conventional photoresists. Sputtered SiO$_2$ or other well-known masks could be substituted for the pyrolytically deposited SiO$_2$.

The silicon nitride deposition is preferably accomplished by flowing a mixture of ammonia, silane and a carrier gas of nitrogen at a temperature of around 1,000° C over the substrate. The process is continued until a thickness of around 1,000A is achieved. After purging the chamber, $SiO_2$ is deposited pyrolytically by flowing a gas of silane and carbon dioxide over the wafer for a period of about 6 minutes.

Figure 5:
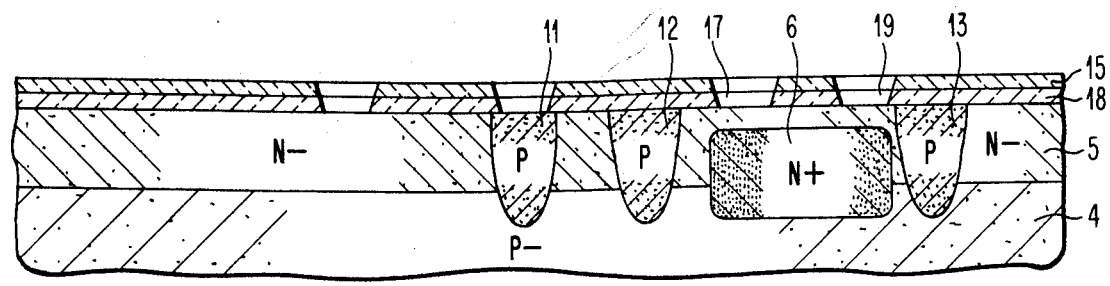

A pattern is then etched in layers 14, 15 and 18 to open areas for the P and N channel regions of the field effect transistors and the base and collector contact regions of the bipolar resistor. The formation of the windows shown in FIG. 5 is accomplished by suitable photolithographic and etching techniques. The pyrolytically deposited $SiO_2$ layer 14 may be etched by a solution of hydroflouric acid buffered in ammonium fluoride, an etchant which does not attack silicon nitride. The areas of nitride layer 15 which are exposed by the windows formed in layer 14 may then be etched in hot phosphoric acid or any other etchant which does not attack silicon dioxide.

After the openings have been made in silicon nitride layer 15 the wafer is exposed to an etchant which will attack the areas of oxide layer 18 which are exposed in the openings of nitride layer 15. Preferably, hydroflouric acid buffered in ammonium flouride, is again used to etch layer 18. This etchant also serves to remove completely the pyrolytically deposited oxide layer 14 which remains on the surface of nitride layer 15.

Figure 6:
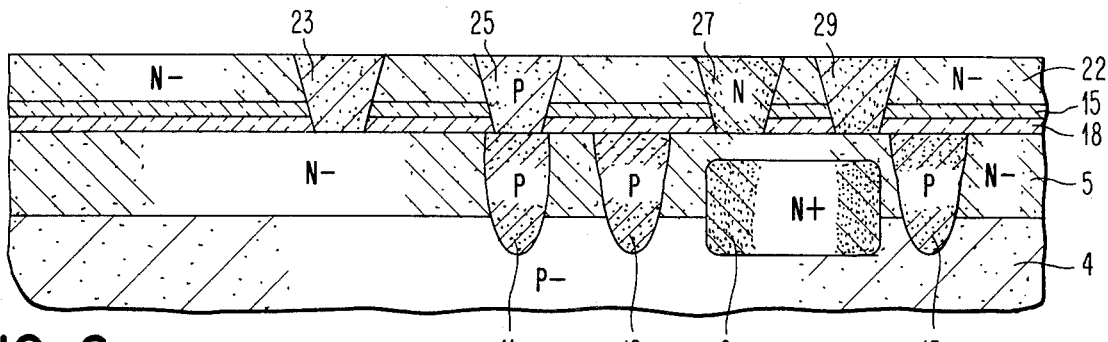

In the next step of the process, a second epitaxial layer 22 of silicon having N— type conductivity is deposited over the entire surface of the substrate. The deposition is performed in the conventional manner to a thickness of between 0.5 and 1.0 microns. The epitaxial deposition results in the growth of polycrystalline silicon 22 over those areas of the substrate covered by silicon nitride 15 and in the deposition of areas of monocrystalline silicon denoted by numerals 23, 25, 27 and 28 over those regions exposed to the surface of layer 5, as shown in FIG. 6. During the heat cycles, buried N+ region 6 will further diffuse toward the surface of layer 5. P region 11 diffuses into monocrystalline N— region 25, thereby inverting this region to P type material.

Figure 7:
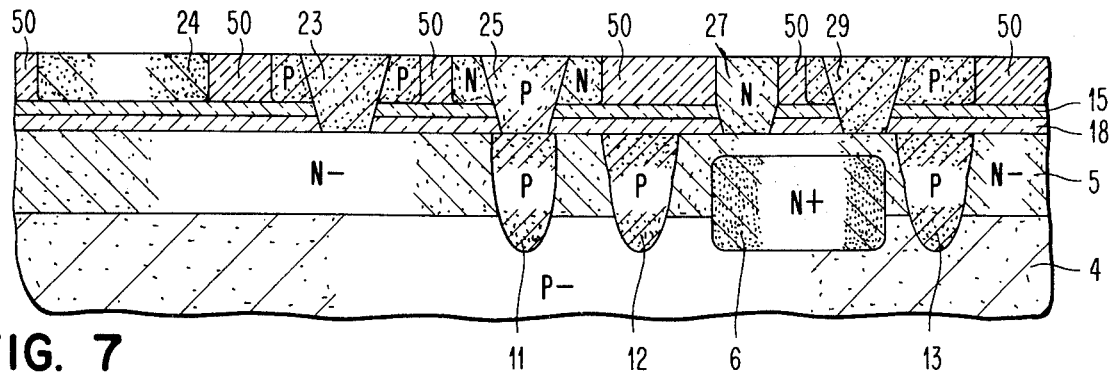

The wafer is next prepared for the formation of recessed oxide isolation (ROI) regions to separate electrically the devices to be formed. These regions are denoted by the numeral 50 in FIG. 7.

The method of forming ROI regions from polycrystalline silicon is described in U.S. patent application Ser. No. 150,609, filed June 7, 1971 entitled, "Method of Forming Dielectric Isolation for High density Semiconductor Devices" in the names of the same inventors as the present invention. In this method, those surfaces of the wafers in which it is not desired to form ROI are covered by an insulating material such as silicon nitride (not shown). Openings are made in the nitride layer where ROI is to be formed. The exposed polycrystalline regions are oxidized-through thermally so that the oxidation reaches down to the surface of layer 15.

Figure 8:
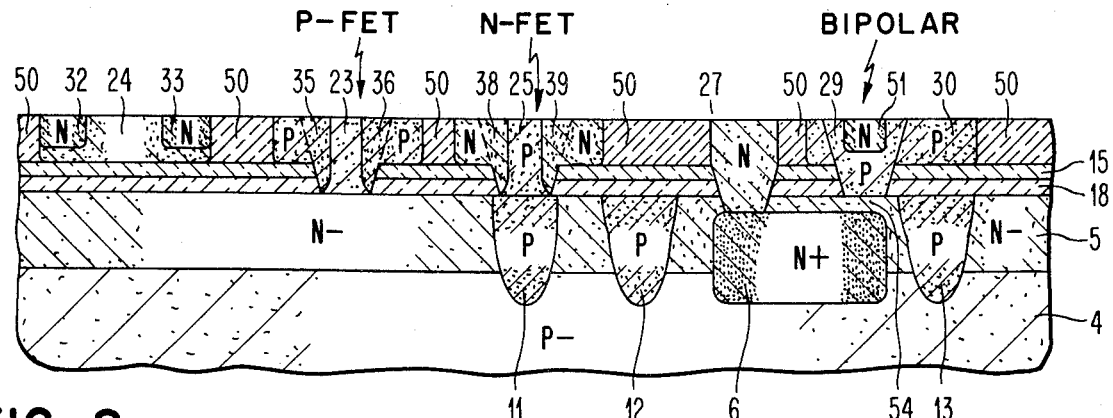

After the formation of the ROI regions, diffusions are made selectively into the polycrystalline and monocrystalline regions to form the active regions of the devices as well as a resistor. As shown in FIG. 8, these devices include an N type resistor, a P-channel FET denoted P-FET, an N-channel FET, denoted N-FET, and an NPN bipolar transistor. The active regions of the devices, i.e., the emitter and intrinsic base regions of the bipolar transistor and the source, drain and channel regions of the field effect transistors are formed in the monocrystalline regions of the wafer. In this way the device characteristics can be carefully controlled, depending on the specific characteristics of the devices which are desired. The inactive portions of the bipolar base region and the field effect transistors are of polycrystalline silicon. This does not deleteriously affect the operation of any of the devices because these areas do not affect transistor operation.

The subsequent formation of ohmic contacts and metallization (not shown) for the devices may be accomplished in well-known ways.

In our process, N type regions 32, 38, 39 and 27 are preferably formed by open-tube diffusion of phosphorous from $POCl_3$ gas. Emitter region 51 comprises arsenic. P type regions 35, 36, 29 and 30 are preferably formed by the diffusion of boron from boron tribromide. The phosphorous diffusion for reach-through region 27 has an impurity level of at least $4 \times 10^{18}$ atoms per $cm^3$. To ensure that the doping level of region 27 is sufficient for subsequent metallization, the arsenic diffusion step for emitter 51 is also performed in region 27.

Our technique for forming resistor 33 is also quite advantageous. In the first place, it is dielectrically isolated throughout — the lower surface is disposed on silicon nitride and the side surfaces are contiguous to ROI. In addition, selected values of resistance may be imparted by diffusion or ion implantation simultaneously with the formation of other regions.

Obviously, either P or N type resistors may be formed. Moreover, the resistors can be merged directly with an active device within the area encompassed by the upper epitaxial layer. For example, an N type resistor is formed in direct contact with reach-through region 27 or a P type resistor with base 29 in region 30.

From the standpoint of the semiconductor process, the critical aspects of our invention lie in the interface of regions 25 and 11 in the N channel FET and the interface between base 29 and subcollector 6 of the bipolar transistor.

With regard to the N channel FET, the source and drain regions 38 and 39 are doped heavily with a surface concentration of about $2 \times 10^{20}$ atoms per $cm^3$ to achieve a very low source-to-drain resistance. As shown in FIG. 8, these N+ regions interface both with the upper channel region 25 as well as the buried region 11. Because the N+ regions are heavily doped, the P region 11 must be relatively lightly doped to avoid a low breakdown at the P-N junction of regions 11–38 and 11–39. If P region 11 had been outdiffused originally from the substrate, without the use of epitaxial layer 5, the doping level of P region 11 at the interface would have been too great to achieve a high breakdown voltage. This is particularly true where bipolar transistors are fabricated simultaneously because, as previously explained, isolation regions 12 and 13 must be highly doped to avoid surface inversion. There would be no effective way of controlling the parameters of P regions 11, 12 and 13 without the use of epitaxial layer 5.

With regard to the bipolar transistor, the base diffusion is preferably accomplished by means of a boron capsule source with an initial surface concentration of $4 \times 10^{19}$ atoms per $cm^3$. This level is subsequently reduced by the base reoxidation. If subcollector 6 outdiffused sufficiently to contact base region 29, this intersection of two heavily doped junctions would result in a very low breakdown voltage. Thus, it is important that a portion of N– epitaxial layer 5 lie between P region 29 and N+ subcollector region 6. This portion is shown by the numeral 54 in FIG. 8. Control of the N+ subcollector outdiffusion to achieve this purpose is best achieved by our double epitaxial layer process. Without it, the P+ base region would be diffused directly into the subcollector, thereby resulting in an essentialy zero breakdown voltage.

For an epitaxial layer 5 with a thickness of 2 microns, the penetration of subcollector 6 is about 0.8 microns after the device is completed. This leaves a 1.2 micron separation between base and subcollector. The resulting $BV_{cbo}$ is around 41 volts, corresponding to a $BV_{ceo}$ of around 11 volts. These parameters hold for the standard epitaxial process. If the low temperature, low pressure epitaxial deposition described by Boss et al. in U.S. Pat. No. 3,765,960 were used, then the penetration of the subcollector into the epitaxial layer is reduced to around 0.4 microns. In this event, the thickness of the epitaxial layer could be as low as 1.6 microns.

To guarantee that there are no parasitic currents betwen the field effect transistors adjacent each other, it is desirable to form a P+ guard ring (not shown) around the upper surface of P region 11 under dielectric layer 18. This is best accomplished during the step of diffusing added impurities into the bipolar isolation region from the upper surface of epitaxial layer 5. This step is optional.

Because of the extent of the outdiffusion of region 11 to form channel region 25 for the N channel FET, it is desirable to adjust the surface concentration of layer 25. This is easily accomplished by a standard shallow ion implant of boron into the channel region to adjust the threshold voltage. The threshold voltage of the P channel transistor is adjusted by the precise doping of epitaxial layer 22, as is well known.

Figure 9:
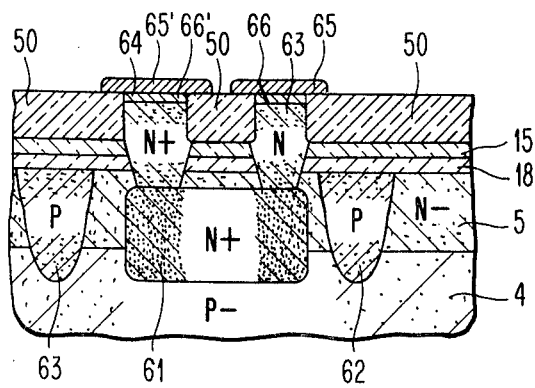
FIG. 9 is a sectional view of a Schottky Barrier diode fabricated during the fabrication of the BI-CMOS transistors.

FIG. 9 illustrates a Schottky barrier diode which can be fabricated simultaneously with, and using substantially the same processing steps as, the manufacture of our BI-CMOS devices. Buried region 61, which serves as a conductive path from anode to cathode of the diode, is preferably formed at the same time as subcollector 6 of the bi-polar transistor. Guard regions 62 and 63 form a ring about the buried region 61 and are preferably formed in the same steps as regions 12 and 13 in FIG. 8. N type regions 63 and 64 comprise the cathode and anode contact regions of the Schottky barrier diode, respectively. These regions are formed in substantially the same way as regions 27 and 29 of the bi-polar transistor. One difference, however, is that anode region 64 is of the same conductivity type as cathode region 63 and buried region 61. The diode is completed by depositing layers 66 and 66' of platinum silicide or some other metal which has been found suitable for use in Schottky barrier diodes. Layers of aluminum 65 and 65' are deposited on the surface of the platinum silicide to provide the surface metallization of the device.

In FIG. 8 isolation region 13 is disposed directly under extrinsic base region 30 of the bipolar transistor. One advantage of this configuration is a saving of chip space as compared to prior devices where the isolation region surrounds the base. In addition, base region 30 may be taken outside of region 13 along the upper epitaxial layer. Base 30 may then be connected directly to another semiconductor region, such as the extrinsic base region of another transistor disposed in the upper epitaxial layer. This eliminates the need for an overpass conductor on the first level of metallization.

While the invention has been particularly shown and described with reference to the preferred embodiments thereof, it will be understood by those skilled in the art that the foregoing and other changes in form and details may be made therein without departing from the spirit and scope of the invention.

We claim:
1. A semiconductor integrated circuit comprising:
   a monocrystalline semiconductor substrate of a first conductivity type;
   a first monocrystalline layer of a second conductivity type disposed over said substrate;
   a subcollector region of said second conductivity type extending from said substrate into said first layer and below the upper surface thereof;
   second and third regions of said first conductivity type extending from said substrate to the upper surface of said first layer, said second region surrounding said subcollector region, the conductivity level of said second region being greater than that of said third region;
   a dielectric layer disposed over said first monocrystalline layer having openings therein over said subcollector region, said third region and at another location over said first monocrystalline layer;
   a second layer disposed over said dielectric layer and in said openings;
   said second layer including monocrystalline regions over the portions of said first monocrystalline layer exposed by said openings, polycrystalline regions over said dielectric layer in areas contiguous to each said monocrystalline region, and dielectric isolation regions separating each said contiguous polycrystalline/monocrystalline regions from every other contiguous polycrystalline/monocrystalline region;
   a bipolar transistor of said second conductivity type formed in said monocrystalline region over said subcollector;
   field effect transistors of second and first channel types formed in said monocrystalline regions over said third region and said another location, respectively; and
   a polycrystalline silicon resistor formed in a polycrystalline region disposed over said dielectric layer.

2. An integrated circuit as in claim 1 wherein said polycrystalline region containing said resistor is dielectrically isolated from said monocrystalline regions.

3. An integrated circuit as in claim 2 wherein said resistor is of a first conductivity type and is located in said polycrystalline region which is contiguous to the base of said bipolar transistor.

4. An integrated circuit as in claim 1 further comprising;
   a reach-through region of a second conductivity type formed in said second layer and connected to said subcollector region through an opening in said dielectric layer;
   said reach-through region including a polycrystalline silicon region contiguous thereto;
   wherein said polycrystalline resistor is of said second conductivity type and is located in said region contiguous to said reach-through region.

5. A semiconductor integrated circuit comprising:

a monocrystalline semiconductor substrate of a first conductivity type;

a first monocrystalline layer of a second conductivity type disposed over said substrate;

a subcollector region of said second conductivity type extending from said substrate into said first layer and below the upper surface thereof;

second and third regions of said first conductivity type extending from said substrate to the upper surface of said first layer, said second region surrounding said subcollector region, the conductivity level of said second region being greater than that of said third region;

a dielectric layer disposed over said first monocrystalline layer having openings therein over said subcollector region, said third region and at another location over said first monocrystalline layer;

a second layer disposed over said dielectric layer and in said openings;

said second layer including monocrystalline regions over the portion of said first monocrystalline layer exposed by said openings, polycrystalline regions on the surface of said dielectric layer in areas contiguous to each said monocrystalline region, and dielectric isolation regions separating each said contiguous polycrystalline/monocrystalline regions from every other contiguous polycrystalline/monocrystalline region;

field effect transistors of second and first channel types formed in said monocrystalline regions over said third region and said another location, respectively;

a bipolar transistor of said second conductivity type formed in said contiguous polycrystalline/monocrystalline region over said subcollector;

said bipolar transistor including emitter and intrinsic base regions in said monocrystalline region and an extrinsic base region in said polycrystalline region;

at least a portion of said extrinsic base region being located over said second region.

6. A semiconductor integrated circuit as in claim 5 and further comprising a resistor located in said extrinsic base region.

7. An integrated circuit as in claim 1 wherein the concentration level of said second region is at least $5 \times 10^{17}$ atoms per $cm^3$ and of said third region is between $4 \times 10^{16}$ and $10^{17}$ atoms per $cm^3$ at the surface of said monocrystalline layer.

* * * * *